United States Patent
Ogita et al.

(10) Patent No.: US 7,348,916 B2
(45) Date of Patent: Mar. 25, 2008

(54) PIPELINE A/D CONVERTER AND METHOD OF PIPELINE A/D CONVERSION

(75) Inventors: Shinichi Ogita, Kyoto (JP); Mitsuhiko Otani, Hyogo (JP); Kouji Yamaguchi, Kyoto (JP); Takayasu Kito, Osaka (JP); Naohisa Hatani, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/479,011

(22) Filed: Jun. 30, 2006

(65) Prior Publication Data

US 2007/0008282 A1    Jan. 11, 2007

(30) Foreign Application Priority Data

Jul. 4, 2005    (JP) ............................ 2005-195307

(51) Int. Cl.
    *H03M 1/38* (2006.01)
(52) U.S. Cl. ...................... 341/161; 341/144; 341/155
(58) Field of Classification Search ................ 341/161, 341/120, 118, 144, 155, 122
See application file for complete search history.

(56) References Cited

U.S. PATENT DOCUMENTS 6,642,871 B2 * 11/2003 Takeyabu et al. ........... 341/120
6,700,524 B2 *  3/2004 Naka et al. ................. 341/161
2006/0044173 A1 *  3/2006 Dosho et al. ............... 341/161

FOREIGN PATENT DOCUMENTS

JP         2001-352242         12/2001

OTHER PUBLICATIONS

Yang et al., "A 3-V 340-mW 14-b 75 Msample/s CMOS ADC With 85-dB SFDR at Nyquist Input" IEEE Journal of Solid-State Circuits, vol. 36, No. 12, Dec. 2001, pp. 1931-1936.

* cited by examiner

*Primary Examiner*—Peguy JeanPierre
(74) *Attorney, Agent, or Firm*—Hamre, Schumann, Mueller & Larson, P.C.

(57) ABSTRACT

A pipeline A/D converter of the present invention includes a plurality of stages each operating for A/D conversion and a digital computing portion that outputs an A/D converted signal based on a digital signal output from each of the stages. In each of the stages, an analog signal from the preceding stage is sampled by passive elements C1 and C2 in a first period, and one of the passive elements is used as a feedback element in a second period to perform adding/subtracting with respect to the signal sampled by the other passive element. By the control from the digital computing portion, a test signal Tink is used instead of an analog output signal Vo(k−1), and a unique conversion-error value is detected and corrected based on the digital signal obtained by the operation of each of the stages. It is possible to obtain a high-resolution A/D convert that can suppress a conversion error caused by the relative error of capacitors used for analog signal processing without decreasing the speed of A/D conversion.

4 Claims, 9 Drawing Sheets

PIPELINE A/D CONVERTER AND METHOD OF PIPELINE A/D CONVERSION

BACKGROUND OF THE INVENTION

1. Field of the Invention

The present invention relates to a pipeline A/D converter that performs A/D conversion using a plurality of operational stages that are connected in series and to a method of performing pipeline A/D conversion.

2. Description of Related Art

As digitization proceeds in the fields of audiovisual and telecommunication, it has been required for A/D converters used as key devices in these fields to achieve higher speed and higher resolution.

Figure 7:
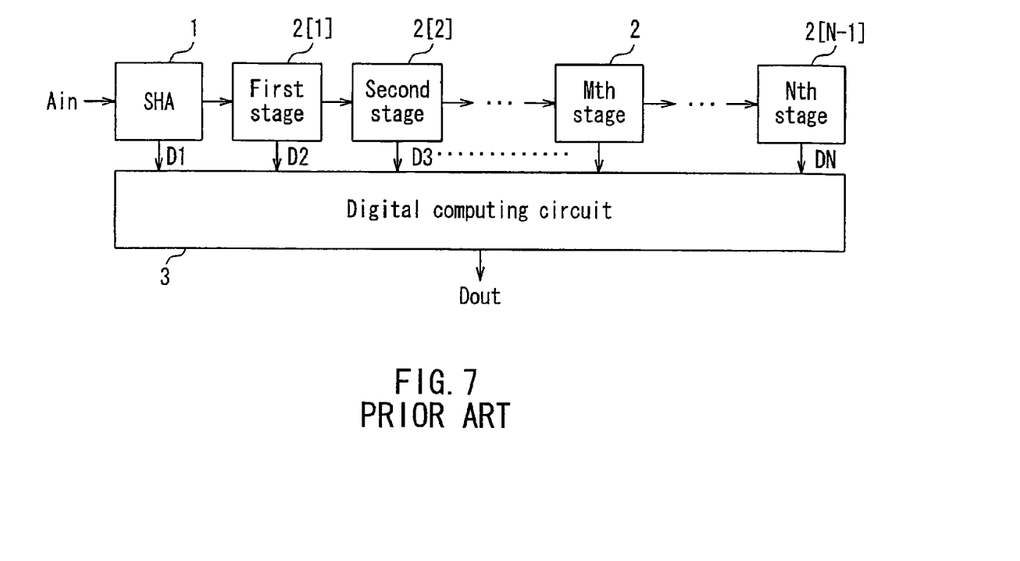
FIG. 7 is a block diagram showing the configuration of a conventional pipeline A/D converter.

FIG. 7 is a block diagram showing the configuration of a generally used pipeline A/D converter. This pipeline A/D converter includes a sample hold circuit 1 to which an analog input signal Ain is input and (N−1) stages (a first stage 2[1] to an (N−1)th stage 2[N−1]) connected in series with the sample hold circuit 1. In the following description, the stages 2[1] to 2[N−1] may be referred to generically as "stages 2[k]", where k denotes an integer from 1 to (N−1).

The sample hold circuit 1 and the stages 2[k] output digital signals D1 to DN, respectively, to supply them to a digital computing circuit 3. The digital computing circuit 3 outputs an N-bit A/D converted output signal Dout based on the digital signals D1 to DN. The number (N−1) of the stages 2[k] connected in series varies depending on the resolution of the A/D converter.

The sample hold circuit 1 includes a sample hold portion that samples and holds the analog input signal Ain and a ternary coding circuit. The sample hold amplifier (SHA) circuit 1 determines a digital signal D1 as ternary data based on a voltage Vo(1) that has been sampled and held by the sample hold portion, and outputs the digital signal D1 to the digital computing circuit 3. The digital signal D1 also is supplied to the first stage 2[1] at the same time. To the first stage 2[1], the voltage Vo(1) is supplied as an analog output signal. In the first stage 2[1], a digital signal D2 and an analog output signal Vo(2) are generated based on the digital signal D1 and the analog output signal Vo(1), and the thus-generated digital signal D2 and analog output signal Vo(2) are output to the digital computing circuit 3 and the second stage 2[2]. Similarly, in the kth stage 2[k], a digital signal Dk and an analog output signal Vo(k) are generated based on a digital signal D(k−1) and an analog output signal Vo(k−1), and the thus-generated digital signal Dk and analog output signal Vo(k) are output to a subsequent (k+1)th stage 2[k+1].

Figure 8:
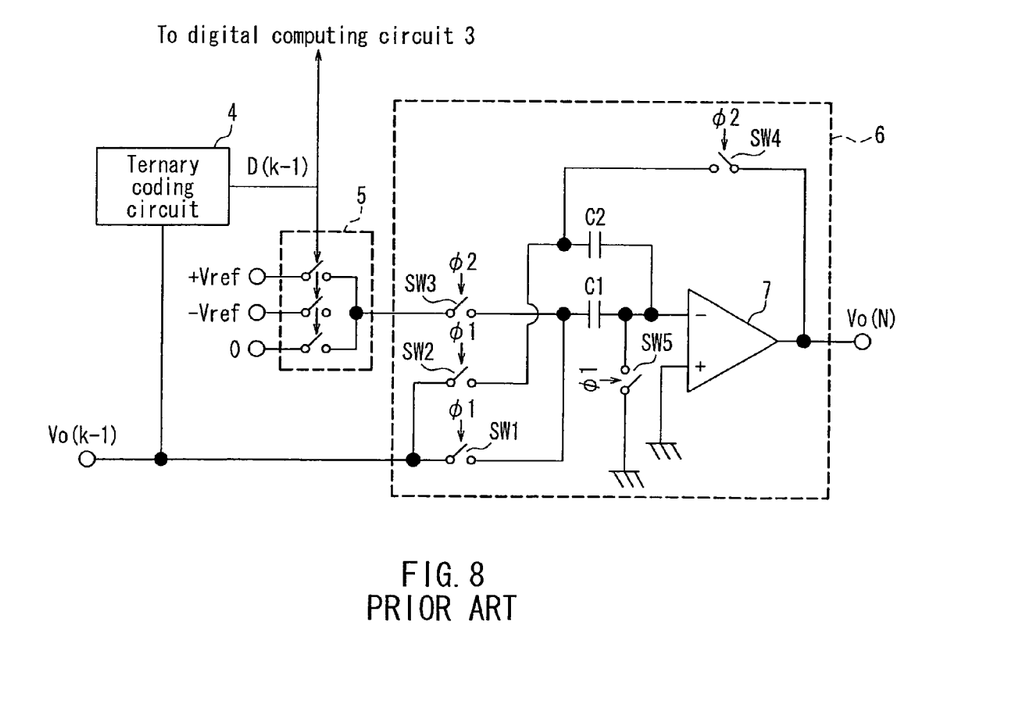
FIG. 8 is a block diagram showing an example of stages included in the conventional pipeline A/D converter.

The stage 2[k] has a configuration as shown in FIG. 8, and includes a ternary coding circuit 4, an analog reference signal generation circuit 5, and an analog signal processing circuit 6. It is to be noted here that, for the sake of convenience in illustration, FIG. 8 shows the ternary coding circuit 4 that belongs to a preceding (k−1)th stage 2[k−1]. Thus, an analog output signal Vo(k−1) of the (k−1)th stage 2[k−1] is input to the ternary coding circuit 4, and the ternary coding circuit 4 outputs a digital signal D(k−1) based on this analog output signal Vo(k−1).

The digital signal D(k−1) output from the ternary coding circuit 4 is input to the analog reference signal generation circuit 5 of the kth stage 2[k]. The analog reference signal generation circuit 5 outputs an analog reference signal +Vref, −Vref, or 0V depending on the digital signal D(k−1) and supplies it to the analog signal processing circuit 6. The analog output signal Vo(k−1) from the preceding stage further is input to the analog signal processing circuit 6, and the analog signal processing circuit 6 performs an amplifying operation by adding the analog output signal Vo(k−1) and the analog reference signal.

Figure 9:
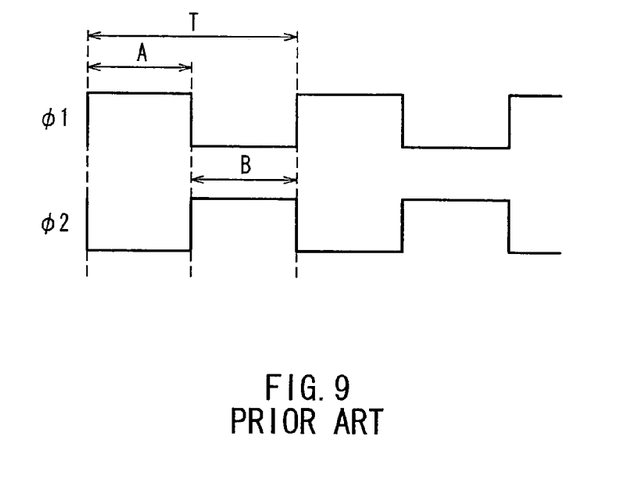
FIG. 9 is a timing chart of an operation clock used in the pipeline A/D converter shown in FIG. 7.

The analog signal processing circuit 6 is a switched-capacitor type amplifier using capacitors. The analog signal processing circuit 6 includes an operational amplifier 7, capacitors C1 and C2 (hereinafter, the capacitances of the capacitors C1 and C2 also are denoted with C1 and C2, respectively), and switches SW1, SW2, SW3, SW4, and SW5. The switches SW1, SW2, and SW5 are turned ON/OFF according to a clock timing Φ1 shown in FIG. 9. On the other hand, the switches SW3 and SW4 are turned ON/OFF according to a clock timing Φ2.

Next, an operation of the analog signal processing circuit 6 in FIG. 8 will be described. In the clock timing shown in FIG. 9, T represents a period in which a single A/D conversion is performed. The period T includes a period A and a period B. In the period A of the clock timing, the switches SW1, SW2, and SW5 shown in FIG. 8 are turned ON while the switches SW3 and SW4 are turned OFF, so that electric charges of the analog output signal Vo(k−1) from the preceding stage are sampled by the capacitors C1 and C2. In the period B of the clock timing, the switches SW3 and SW4 shown in FIG. 8 are turned ON while the switches SW1, SW2, and SW5 are turned OFF. Thus, the electric charges that have been sampled by the capacitors C1 and C2 in the period A are reallocated, so that, in accordance with the principle of conservation of charge, an analog output signal Vo(k) with a value corresponding to (C1+C2)/C2 times the voltage obtained by adding/subtracting the analog reference signal to/from the analog output signal Vo(k−1) is output from the operational amplifier 7.

The analog signal processing circuit 6 in each of the stages operates in the above-described manner. The pipeline A/D converter with the above-described configuration as a whole operates in such a manner that, for example, the sample hold circuit 1 and the even-numbered stages perform the sampling operation in the period A of the clock timing shown in FIG. 9 and perform the amplification by a factor of (C1+C2)/C2 and the output in the period B, while the odd-numbered stages perform the sampling operation in the period B shown in FIG. 9 and perform the amplification by a factor of (C1+C2)/C2 and the output in the period A.

As also described in "IEEE J. SOLID-STATE CIRCUITS, Vol. 36, pp. 1931-1936, December 2001, 'A 3-V 340-mW 14-b 75-Msample/s CMOS ADC With 85-dB SFDR'", the relative accuracy of capacitors constituting an operational amplifier determines the resolution of an A/D converter. It has been known that a capacitor with a larger capacitance generally achieves a higher relative accuracy and the capacitance conforming to the desired resolution needs to be set based on the relative accuracy of the capacitor.

However, in the case of an A/D converter of more than 14 bits, capacitors used therein are required to achieve a very high relative accuracy. This is because errors in the respective stages accumulate to be amplified due to an error in relative accuracy of the capacitor in each of the stages, so that the effect thereof becomes nonnegligible in the end. In order to eliminate the influence of the error accumulation caused by the relative accuracy of the capacitor, JP 2001-352244 A discloses the configuration of each stage as shown in FIGS. 10 to 12.

Figure 10:
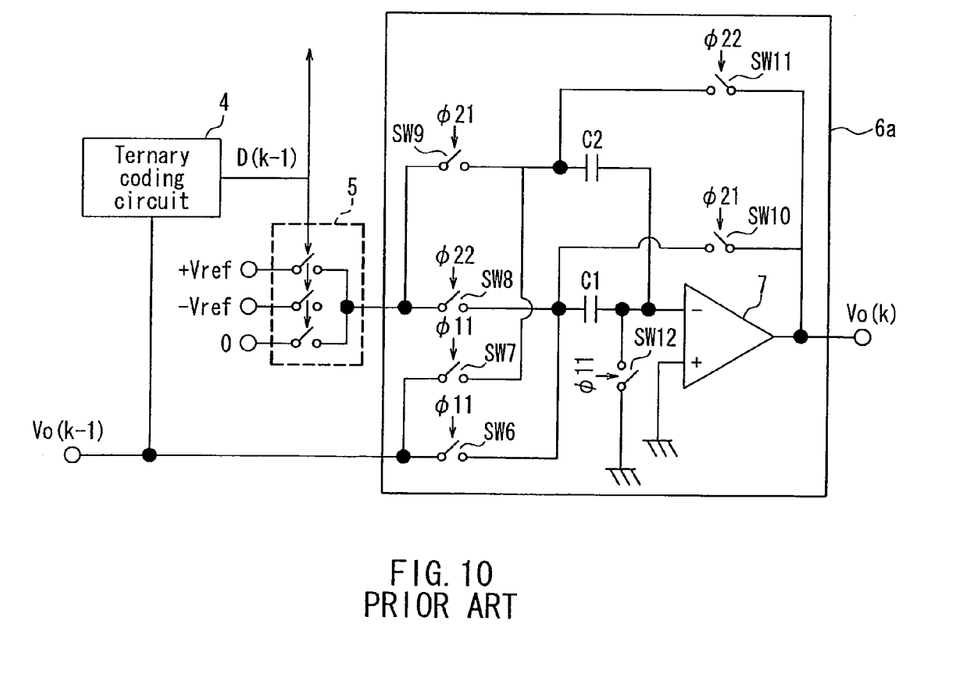
FIG. 10 is a circuit diagram showing an example of stages included in another conventional pipeline A/D converter.

A ternary coding circuit 4 and an analog reference signal generation circuit 5 shown in FIG. 10 have the same configurations as those in FIG. 8. However, the configuration of an analog signal processing circuit 6a is different from that shown in FIG. 8, and switches SW6 to SW12 are provided for an operational amplifier 7 and capacitors C1 and C2. The switches SW6, SW7, and SW12 are turned ON/OFF according to a clock timing Φ11 shown in FIG. 11. The switches SW9 and 10 are turned ON/OFF according to a clock timing Φ21. The switches SW8 and SW11 are turned ON/OFF according to a clock timing Φ22.

Figure 11:
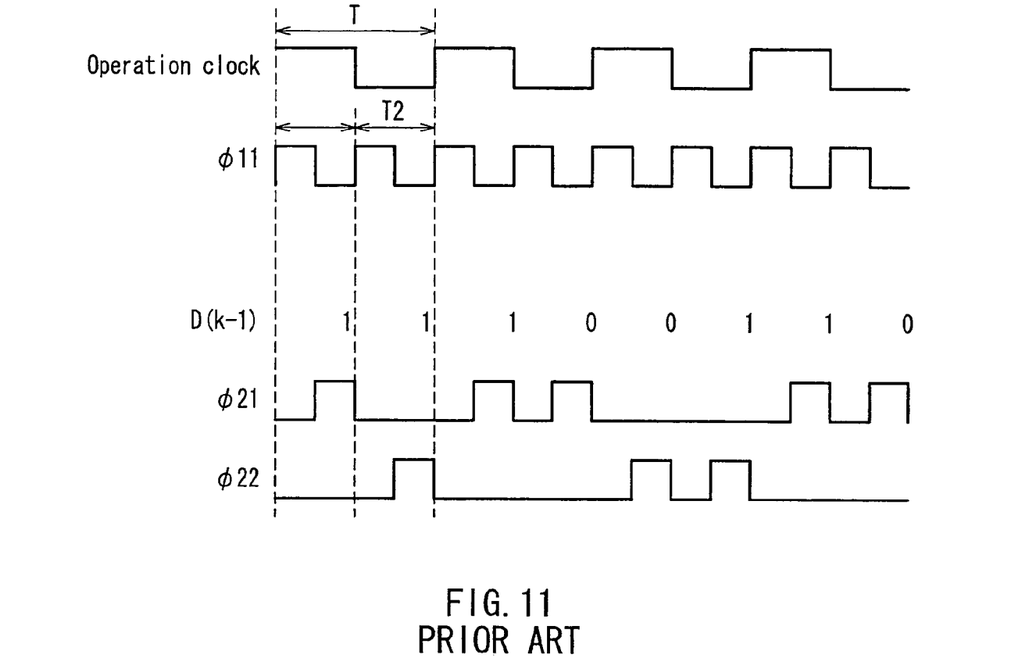
FIG. 11 is a timing chart of an operation clock used in the pipeline A/D converter shown in FIG. 10.
Figure 12:
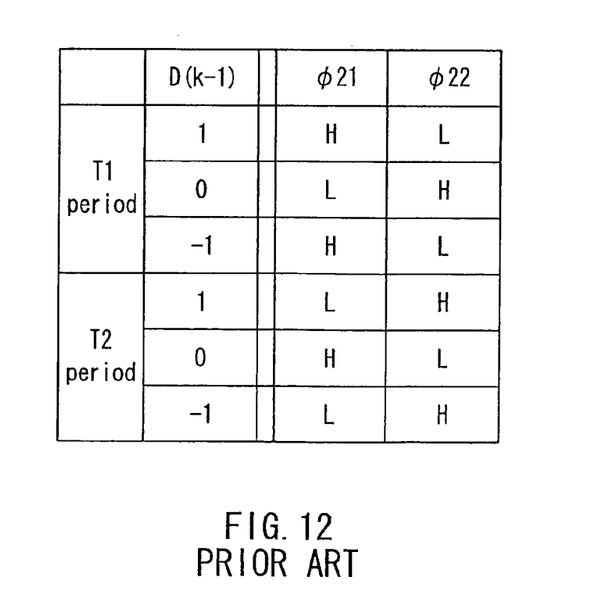
FIG. 12 is a diagram showing the relationship between the state of a digital signal that is input to each of the stages used in the pipeline A/D converter shown in FIG. 10 and a control signal generated in accordance with the digital signal.

With this configuration, the analog signal processing circuit 6a performs, in periods T1 and T2 obtained by dividing a period T of the clock timing shown in FIG. 11 into two equal periods, a sampling and holding operation twice on a time-division basis according to the clock timing Φ11. The analog signal processing circuit 6a outputs an analog output signal Vo(k) in each of the sampling and holding operations. That is, in each of the first period T1 and the second period T2 in FIG. 11, an analog output signal from the preceding stage is sampled by the first and second capacitors, and thereafter, either one of these capacitors is used as a feedback element of the operational amplifier 7 and the operational amplifier 7 performs addition/subtraction of a predetermined analog reference signal output from the analog reference signal generation circuit 5 to/from the analog output signal that has been sampled by the other capacitor.

Furthermore, based on an analog output signal Vo(k−1) from the preceding stage, the ternary coding circuit 4 performs ternary coding in each of the period T1 and the period T2 shown in FIG. 11. Then, as shown in FIG. 12, the configuration of the operational amplifier 7 included in each of the stages is switched depending on its logic state. With this configuration, it is possible to minimize the error caused by the relative accuracy of the capacitors.

More specifically, in the period T1, the first capacitor is used as a feedback element when the output from the ternary coding circuit 4 is in a first logic state, and the second capacitor is used as a feedback element when the output from the ternary coding circuit 4 is in a second logic state. On the other hand, in the period T2, the second capacitor is used as a feedback element when the output from the ternary coding circuit 4 is in the first logic state, and the first capacitor is used as a feedback element when the output from the ternary coding circuit 4 is in the second logic state. Furthermore, the outputs obtained in the periods T1 and T2 that have been coded into ternary data by the ternary coding circuit 4 in each of the stages are averaged by an averaging circuit. This allows the integrated error to be minimized, thus realizing a high-resolution A/D converter.

However, with the above-described conventional configuration, the operations in the first period T1 and the second period T2 are performed within the operation period of the A/D converter (the period T in FIG. 11). Thus, when the A/D converter is operated at a high speed, the operational amplifier and the ternary coding circuit included in each of the stages need to achieve a very high operation speed. Therefore, it is very difficult to realize a high-resolution and high-speed A/D converter.

SUMMARY OF THE INVENTION

It is an object of the present invention to provide a high-resolution pipeline A/D converter that can suppress a conversion error caused by the relative error of capacitors used for analog signal processing in each stage without decreasing the operation speed of A/D conversion.

The pipeline A/D converter according to the present invention includes: a plurality of stages connected in series, each of which operates for A/D conversion and outputs a digital signal; a digital computing portion that performs computation for outputting an A/D converted output signal based on the digital signal output from each of the stages; and a clock generating portion that supplies a clock signal for controlling an operation of each of the stages. Each of the stages includes: a reference signal output portion that outputs a predetermined analog reference signal in accordance with the digital signal from the preceding stage; an analog signal processing portion that adds/subtracts the analog reference signal to/from an analog output signal from the preceding stage and outputs the thus obtained result as an analog output signal of the present stage; and a multivalued coding portion that outputs the digital signal in accordance with the analog output signal of the present stage. The analog signal processing portion includes an operational amplifier, a first passive element, and a second passive element. The analog output signal of the preceding stage is sampled by both the passive elements in a first period while one of the passive elements is used as a feedback element of the operational amplifier in a second period so that the signal sampled by the other passive element is added/subtracted to/from the analog reference signal of the reference signal output portion by the operational amplifier.

In order to solve the above-described problem, the digital computing portion outputs first and second control signals for controlling the operation of each of the stages, performs computation by detecting a unique digital-conversion-error value based on the digital signal obtained by the operation of each of the stages performed based on the first and second control signals, and corrects the digital conversion error. The analog signal processing portion and the multivalued coding portion can select a test signal instead of the analog output signal in accordance with the first control signal from the digital computing portion, and the analog signal processing portion selects and uses one of the first passive element and the second passive element as the feedback element in the second period in accordance with the second control signal from the digital computing portion.

A pipeline A/D conversion method according to the present invention performs A/D conversion using a plurality of stages connected in series, each of which operates for A/D conversion and outputs a digital signal. The method includes operating each of the stages in such a manner that an analog output signal output from the preceding stage is sampled by first and second passive elements, the analog output signal is output by using one of the passive elements as a feedback element and performing computation using the signal sampled by the other passive element, and the digital signal is output in accordance with the analog output-signal, and outputting an A/D converted output signal by performing a digital computing operation based on the digital signal from each of the stages.

In order to solve the above-described problems, the pipeline A/D conversion method according to the present invention is characterized in that it further includes the steps of: switching an input signal to each of the stages to a test signal by a first control signal; and switching the passive element used as the feedback element by a second control signal.

DETAILED DESCRIPTION OF THE INVENTION

According to the above-described pipeline A/D converter of the present invention, the analog signal processing portion and the multivalued coding portion can select a test signal instead of the analog output signal in accordance with the first control signal from the digital computing portion, and the analog signal processing portion selects and uses one of the first passive element and the second passive element as the feedback element in the second period in accordance with the second control signal from the digital computing portion. Furthermore, the digital computing portion performs computation by detecting a unique digital-conversion-error value based on the digital signal obtained by the operation of each of the stages performed based on the first and second control signals and corrects the digital conversion error.

With this configuration, in accordance with the control signal from the digital computing portion, it is possible to obtain a unique conversion-error value due to the relative error in the passive elements in each of the stages, so that error correction can be performed by the digital computing portion. Moreover, a series of these operations is performed only in response to the control signal from the digital computing portion, so that the same operations as in the generally used pipeline A/D converter described in the "BACKGROUND OF THE INVENTION" section in the above are performed other than when detecting the error. Thus, the series of operations in each of the stages is performed in the same operation clock period at all times, thus allowing a high-speed A/D conversion frequency to be realized.

In the pipeline A/D converter according to the present invention configured as above, it is preferable that, in accordance with the first and second control signals from the digital computing portion, the clock signal supplied by the clock generating portion is controlled so as to correspond to the operation of each of the stages.

Also, it is preferable that the clock generating portion is configured so as to select and output the clock signal depending on whether the detection of the unique digital-conversion-error value by the digital computing portion is performed in the even-numbered stage or the odd-numbered stage.

Hereinafter, the present invention will be described by way of embodiments with reference to the drawings. The configuration of a pipeline A/D converter according to an embodiment of the present invention will be described with reference to FIGS. 1 to 6.

Figure 1:
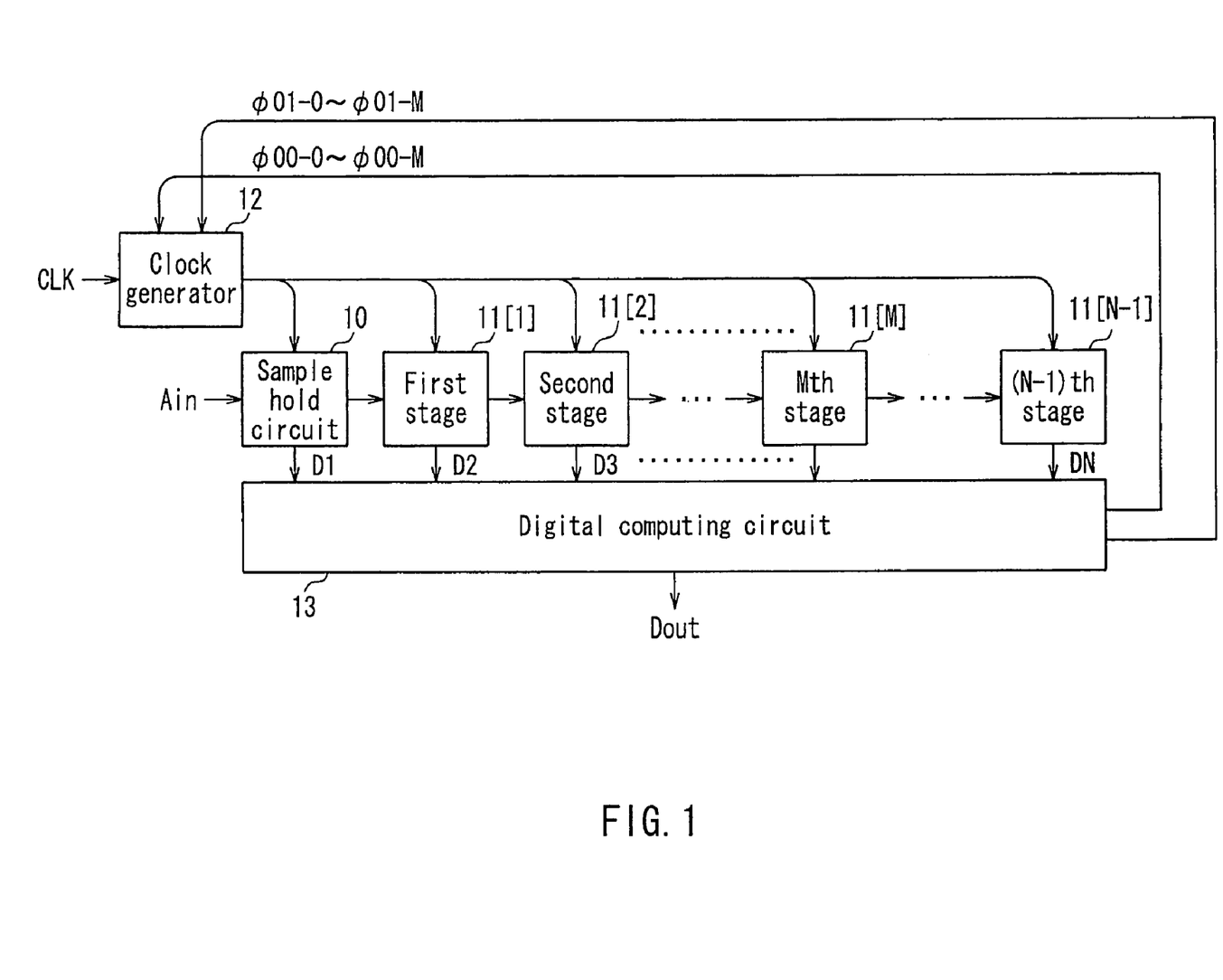
FIG. 1 is a block diagram showing the configuration of a pipeline A/D converter according to an embodiment of the present invention.

As shown in FIG. 1, the pipeline A/D converter according to the present embodiment includes, in order to convert an analog input signal Ain to an N-bit digital output signal Dout in the end, a sample hold circuit 10 and (N−1) stages (a first stage 11[1] to a (N−1)th stage 11[N−1]) connected in series with the sample hold circuit 10. In the following description, the stages 11[1] to 11[N−1] may be referred to generically as "stages 11[k]", where k denotes an integer from 1 to (N−1).

The basic functions of the sample hold circuit 10 and the stages 11[k] are the same as those in the conventional example shown in FIG. 7, and they output digital signals D1 to DN, respectively, to supply them to a digital computing circuit 13. The digital computing circuit 13 outputs an N-bit A/D converted output signal Dout based on the digital signals D1 to DN. The present embodiment is characterized in that the digital computing circuit 13 has an error detecting and correcting function that will be described later.

A clock generator 12 generates an operation clock for each of the stages 11[k] based on a clock signal CLK and supplies it to the corresponding stage. The digital computing circuit 13 supplies first control signals Φ00-0 to Φ00-M and second control signals Φ01-0 to Φ01-M to the clock generator 12. Based on the first and second control signals, the clock generator 12 generates operation clocks in accordance with an ordinary A/D conversion operation and an operation for detecting a unique error value and then correcting it. The unique error value of each of the stages 11[k] is detected out of the output from each of the stages 11[k].

Figure 2:
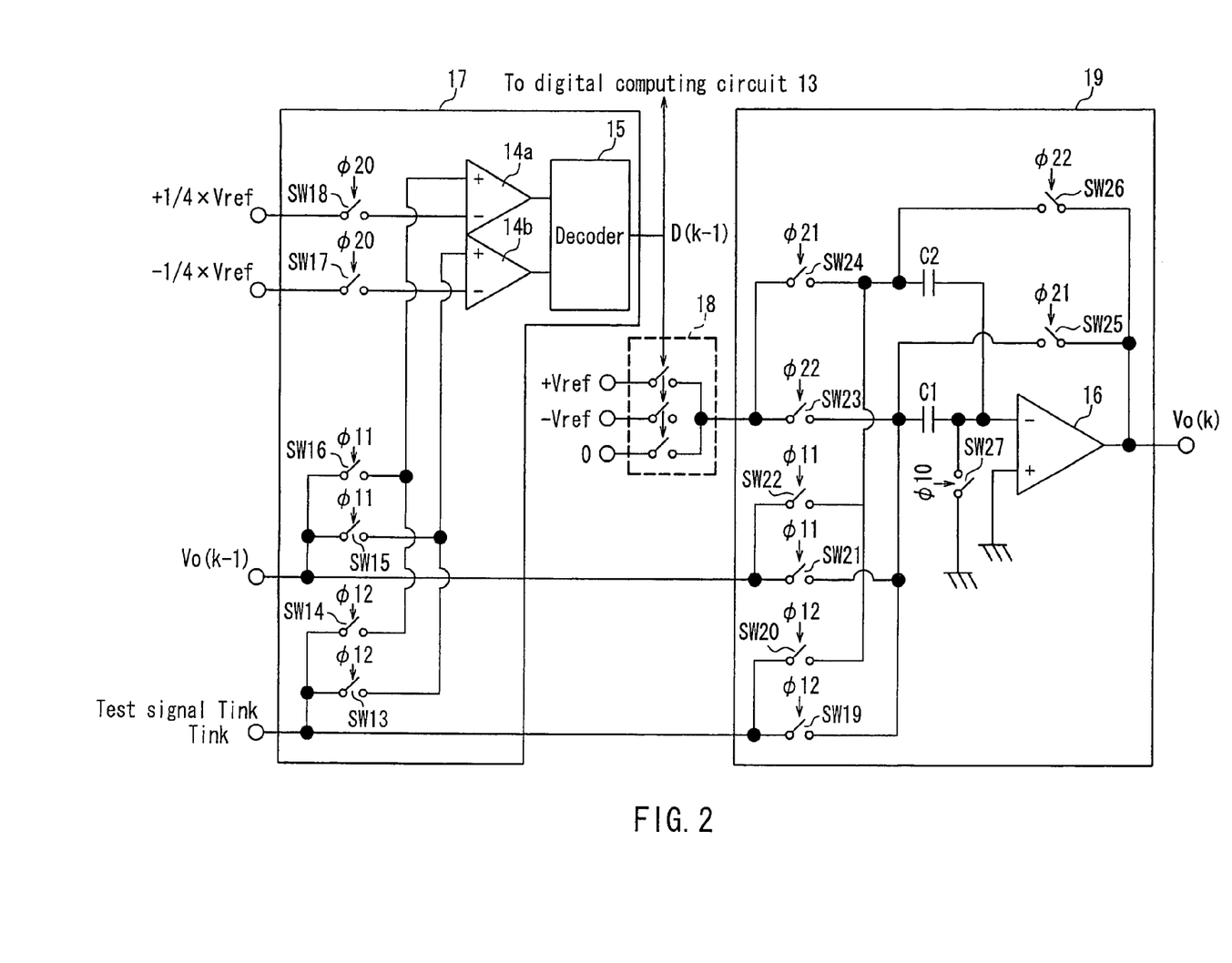
FIG. 2 is a circuit diagram showing an example of stages included in the pipeline A/D converter shown in FIG. 1.

FIG. 2 shows the configuration of the stage 11[k]. The stage 11[k] includes a multivalued coding circuit 17 (A ternary coding circuit is shown as an example), an analog reference signal generation circuit 18, and an analog signal processing circuit 19. It is to be noted here that, for the sake of convenience in illustration, FIG. 2 shows the multivalued coding circuit 17 that belongs to a preceding (k−1)th stage 11[k−1]. Thus, an analog output signal Vo(k−1) of the (k−1)th stage 11[k−1] is input to the multivalued coding circuit 17, and the multivalued coding circuit 17 outputs a digital signal D(k−1) based on this analog output signal Vo(k−1).

The multivalued coding circuit 17 includes two comparators 14*a* and 14*b*, a decoder 15, and switches SW13 to SW18. The switches SW13 and SW14 are operated according to an operation clock Φ12 shown in FIG. 3 and control the input of a test signal Tink. The switches SW15 and SW16 are operated according to an operation clock Φ11 and control the input of the analog output signal Vo(k−1). The switches SW17 and SW18 are operated according to an operation clock Φ20 and control the inputs of −¼×Vref and +¼×Vref, respectively.

To positive-side input terminals of the comparators 14*a* and 14*b*, the analog output signal Vo(k−1) from the preceding stage is input via the switches SW15 and SW16, or alternatively, the test signal Tink is input via the switches SW13 and SW14. To negative-side input terminals of the comparator 14*a* and 14*b*, a positive threshold voltage (+¼×

Vref) and a negative threshold voltage (−¼×Vref) are input, respectively. Outputs from the comparators 14a and 14b are input to the decoder 15.

The decoder 15 generates a digital signal D(k−1) based on the outputs from the comparators 14a and 14b and supplies it to the digital computing circuit 13 and the analog reference signal generation circuit 18. The digital signal D(k−1) is "1" when the analog output signal Vo(k−1) or the test signal Tink input to the decoder 15 is greater than (¼×Vref), "0" when the Vo(k−1) or the Tink is between (¼×Vref) and (−(¼× Vref)), and "−1" when the Vo(k−1) or the Tink is smaller than (−(¼×Vref)).

The analog reference signal generation circuit 18 outputs an analog reference signal in accordance with the digital signal output from the multivalued coding circuit 17. More specifically, the analog reference signal generation circuit 18 selects and outputs (+Vref) when the output from the multivalued coding circuit 17 is "1", (0V) when the output from the multivalued coding circuit 17 is "0", and (−Vref) when the output from the multivalued coding circuit 17 is "−1".

The analog signal processing circuit 19 includes an operational amplifier 16, capacitors C1 and C2, switches SW19 to 27. The analog signal processing circuit 19 is a switched-capacitor type amplifier that uses the capacitors C1 and C2 as passive elements. The switches SW19 and SW20 are operated according to the operation clock Φ12 shown in FIG. 3 and control the input of the test signal Tink. The switches SW21 and SW22 are operated according to the operation clock Φ11 and control the input of the analog output signal Vo(k−1). The switches SW23 and SW24 are operated according to operation clocks Φ22 and Φ21, respectively, and control the input of an output signal from the analog reference signal generation circuit 18. The switches SW25 and SW26 are operated according to the operation clocks Φ21 and Φ22, respectively, and switch the feedback element of the operational amplifier 16 between the capacitors C1 and C2. The switch SW27 is operated according to an operation clock Φ10 and controls the connection to a ground potential. The operational amplifier 16 outputs an analog output signal Vo(k).

Figure 3:
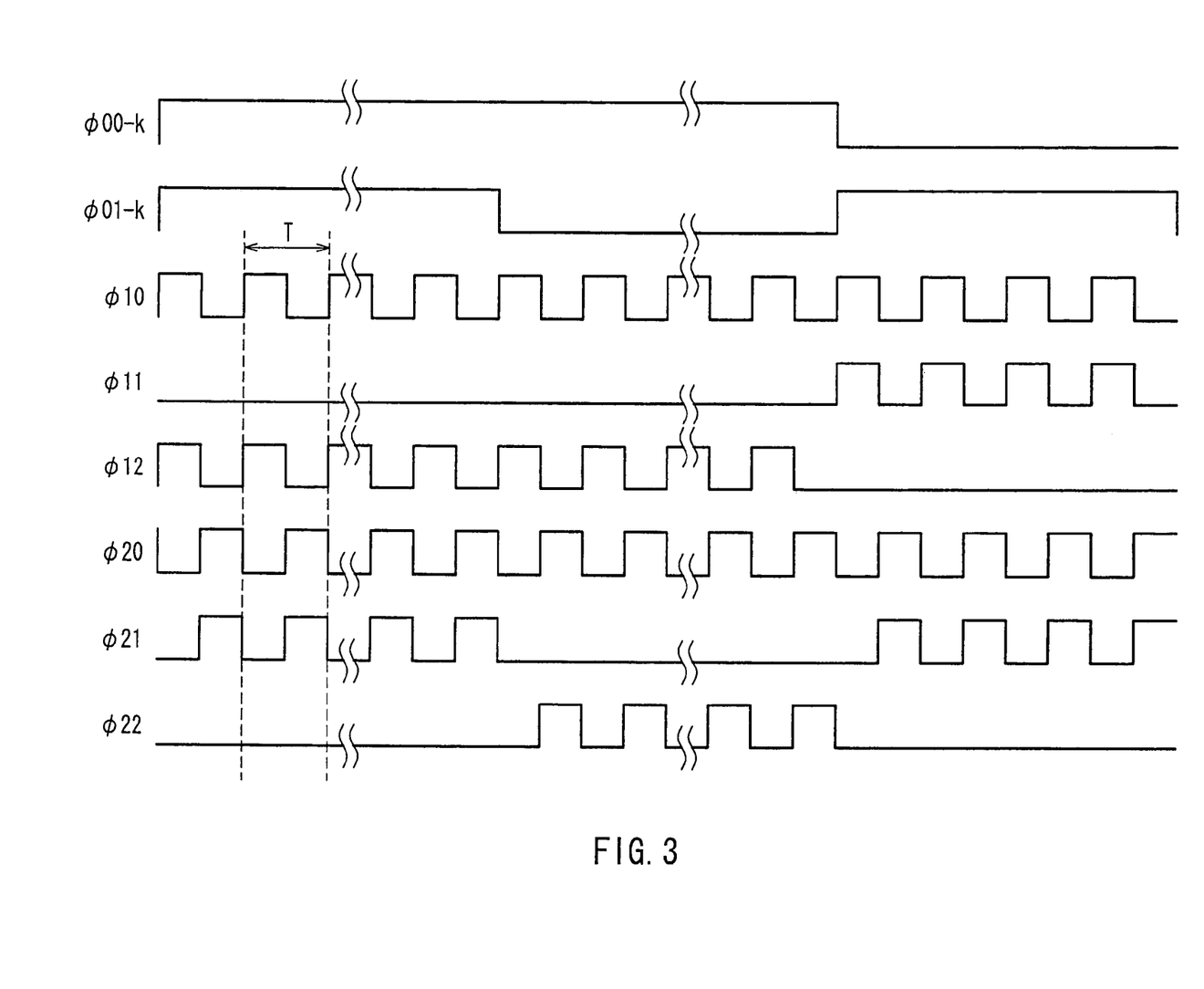
FIG. 3 is a timing chart of an operation clock used in the pipeline A/D converter shown in FIG. 1.

As described above, the sample hold circuit 10 and each of the stages 11[k] are operated according to the operation clock timing shown in FIG. 3, which is supplied by the clock generator 12. The sample hold circuit 10 outputs an analog output signal Vo(1) based on the analog input signal Ain through a single sampling and holding operation performed in the period T shown in FIG. 3. Based on this output signal, a digital signal D1 is determined by the multivalued coding circuit 17 of a subsequent first stage 11[1]. That is, each of the stages 11[1] to 11[N−1] outputs an analog output signal Vo(k) based on an analog output signal Vo(k−1) output from the sample hold circuit 10 or the preceding stage, through the single sampling and holding operation performed in the period T shown in FIG. 3. Furthermore, based on the analog output signal Vo(k), a digital signal Dk is input to the digital computing circuit 13 having an error detecting and correcting function by the multivalued coding circuit 17 of each of the stages.

In the pipeline A/D converter according to the present embodiment, when a correction starting signal is input to the digital computing circuit 13, first control signals Φ00-0 to Φ00-M that can control the input signals of the stages to be subjected to error correction, and second control signals Φ01-0 to Φ01-M are output from the digital computing circuit 13 for a few clock periods.

The first control signals are output in the following order, for example. When the input signal control is performed successively from the first stage 11[1] to the stages downstream therefrom, the first control signals are output in the order of Φ00-0, Φ00-1, ..., Φ00-M. Alternatively, when the input signal control is performed successively from Mth stage 11[M] to the stages upstream therefrom, the first control signals are output in the order of Φ00-M, ..., Φ00-1, Φ00-0. Each of the first control signals Φ00-0 to Φ00-M has a waveform such that, like the waveform of Φ00-k shown in FIG. 3, it is at a high level during the control period of the corresponding stage and is turned to a low level after the completion of the control period. When the first control signal is in the high level period, the input of the analog output signals Vo(1) to Vo(M) is switched to the input of the test signals Tin1 to TinM, as will be described later.

Furthermore, the second control signal Φ1-k has a high level period and a low level period as shown in FIG. 3. More specifically, at the stage where its input signal is controlled by the first control signal Φ00-k, during the period when the first control signal is at the high level, the connection status of the capacitors C1 and C2 in the stage is switched depending on the high level period and the low level period of the second control signal Φ01-k as will described later. The difference between the digital signal Dk before the switching and the digital signal Dk after the switching is detected by the digital computing circuit 13 as error data of the stage subjected to the input signal control, and the data regarding the amount of correction is calculated. A series of these operations is performed during the high level period of the first control signal Φ00-k, and after the completion of the control with respect to all the M stages to be subjected to error correction by the first control signals Φ00-k, the digital computing circuit 13 performs computation for A/D conversion using the data regarding the amount of correction obtained in the respective stages.

The input signal control up to the Mth stage and the control of the connection status of the capacitors C1 and C2 are performed by controlling a clock signal output from the clock generator 12 shown in FIG. 1 based on the first and second control signals.

Figure 4:
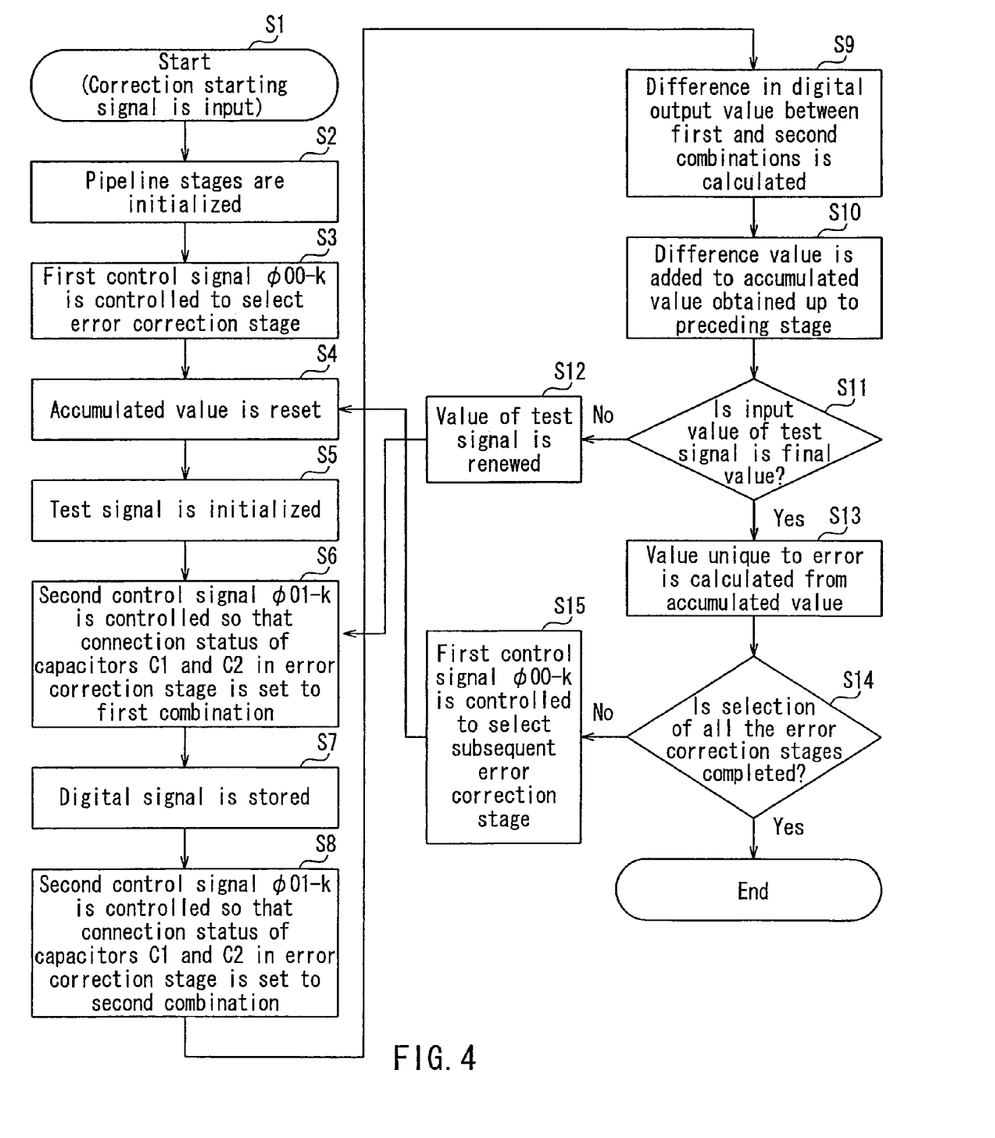
FIG. 4 is a flowchart showing an operation of a digital computing circuit included in the pipeline AID converter shown in FIG. 1.

The operation of the digital computing circuit 13 when the first to Mth stages are to be subjected to error correction in the pipeline A/D converter shown in FIG. 1 will be described with reference to a flowchart of FIG. 4.

First, a correction starting signal is input to the digital computing circuit 13 (Step S1). In response to the correction starting signal, the stages are initialized (Step S2). Then, the first control signal Φ00-k is controlled to select a stage to be subjected to error correction (hereinafter also referred to simply as an "error correction stage") (Step S3). The test signal is input to the stage to which the first control signal Φ00-k is input. Next, the accumulated value of A/D conversion error is reset (Step S4), and then the test signal is initialized (Step S5). That is, a digital signal when the input signal of the A/D converter is changed according to a constant DC step (e.g., the amount of DC change of a ⅛ LSB level) is recorded by this correcting operation, but this input signal of the A/D converter is reset to its initial value.

Next, the second control signal Φ01-k is controlled so that the status of the capacitors C1 and C2 in the error correction stage is set to a first combination (Step S6), and the error correction stage is operated and a digital signal Dk1 output therefrom is stored in the digital computing circuit 13 (Step S7). Furthermore, the second control signal Φ01-k is controlled so that the connection status of the capacitors C1 and C2 in the error correction stage is set to a second combination (Step S8), and the error correction stage is operated. The difference between the digital signal Dk2 output from the error correction stage and the digital signal Dk1 stored in Step S7 is calculated (Step S9), and the thus-obtained difference value is added to the accumulated value obtained up to the preceding stage (Step S10).

Next, when the input value of the test signal is not a final value (Step S11), the value of the test signal is renewed (Step 12). Thereafter, the flow goes back to Step S6 and the above-described Steps are repeated. On the other hand, when the input value of the test signal is a final value (Step S11), a unique error value is calculated from the accumulated value (Step 13).

Next, if the selection of all the error correction stages is not completed (Step S14), the first control signal Φ00-k is controlled to select the subsequent error correction stage (Step S15) and the flow goes back to Step S4 to repeat the above-described Steps. If the selection of all the error correction stages is completed (Step S14), the operation of detecting the unique error value is terminated.

Figure 5:
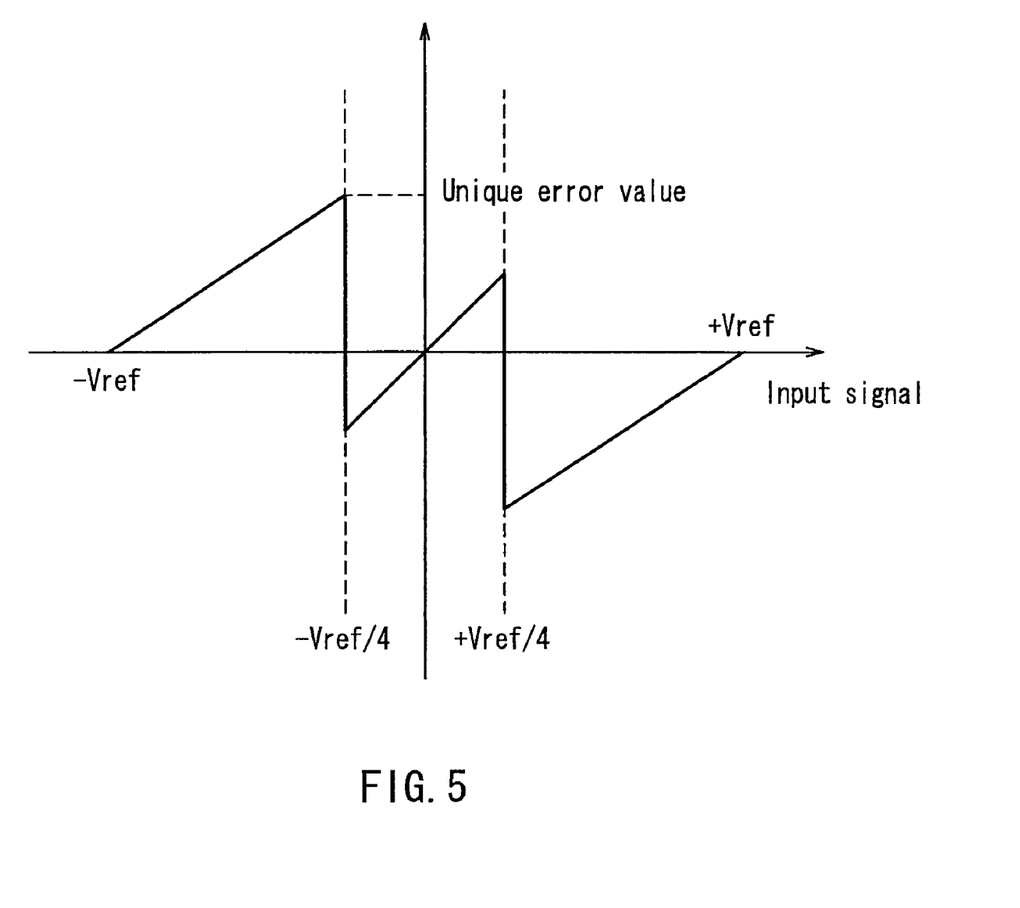
FIG. 5 is a diagram showing error characteristics of the stages included in the pipeline A/D converter shown in FIG. 1.

Through the above-described procedure, the digital computing circuit 13 accumulates the difference values between the digital outputs before and after the switching of the connection status of the passive elements (the capacitors C1 and C2) by controlling the second control signal when the input of the test signal is changed according to a constant DC step, the unique error value shown in FIG. 5 is calculated. After the unique error values of all the M stages to be subjected to error correction have been obtained by controlling the first control signals, the computation shown in Equation 1 below is set to complete the error correction.

Corrected digital output=(Digital output from the A/D converter before correction)−Σ(Result of the calculation of the unique error values)     (1)

In the following, the operation of each of the stages in the pipeline A/D converter according to the present embodiment will be described more specifically with reference to FIGS. 2 and 3.

With the configuration of the stage shown in FIG. 2, in the high level period of the first control signal Φ00-k supplied from the digital computing circuit 13, the operation clock Φ11 is fixed at a low level and the stage is operated according to the operation clock Φ12. In the low level period of the first control signal Φ00-k, the operation clock Φ12 is fixed at a low level and the stage is operated according to the operation clock Φ11. On the other hand, in the high level period of the second control signal Φ01-k, the operation clock Φ22 is fixed at a low level and the stage is operated according to the operation clock Φ21. In the low level period of the second control signal Φ01-k, the operation clock Φ21 is fixed at a low level and the stage is operated according to the operation clock Φ22.

The operation clocks Φ10 and Φ20 shown in FIG. 3 operate without being affected by the first and second control signals from the digital computing circuit 13 at all times. Thus, when the first control signal Φ00-k is in the high level period and the second control signal Φ01-k also is in the high level period in FIG. 3, the stage operates in such a manner that the multivalued coding circuit 17 operates in response to the input of the test signal Tink and the analog signal processing circuit 19 also operates based on the test signal Tink.

First, in the multivalued coding circuit 17, the switches SW13 and SW14 operate according to the timing Φ12, so that the test signal Tink is input to the positive input terminals of the comparators 14a and 14b while the switches SW17 and SW18 operate according to the timing Φ20 so that the threshold voltages (+¼×Vref) and (−¼×Vref) are input to the negative input terminals of the comparators 14a and 14b. The results of the decoding of the outputs from these comparators 14a and 14b are output from the decoder 15.

In the analog signal processing circuit 19, the switches SW19 and SW20 operate according to the timing Φ12, so that the test signal Tink is sampled by the capacitors C1 and C2. At this time, the switch SW27 operates according to the timing Φ10, and electrodes provided on the side opposite to the capacitors C1 and C2 are grounded. Next, according to the timing Φ21, the output from the analog reference signal generation circuit 18 selected depending on the above-described output from the decoder 15 is supplied to one side of the capacitor C2 by the operation of the switch SW24. Furthermore, one side of the capacitor C1 is connected to an output terminal of the operational amplifier 16 by the operation of the switch SW25 so that the capacitor C1 serves as a feedback element. With this configuration, the analog signal processing circuit 19 outputs an analog signal corresponding to the test signal Tink that has been input thereto and multiplied by (C1+C2)/C1.

Next, when the first control signal Φ00-k is in the high level period and the second control signal Φ01-k is in the low level period in FIG. 3, the multivalued coding circuit 17 also operates in response to the input of the test signal Tink, and the analog signal processing circuit 19 also operates based on the test signal Tink. First, in the multivalued coding circuit 17, the test signal Tink is input to the positive input terminals of the comparators 14a and 14b by the operations of the switches SW13 and SW14 according to the timing Φ12, while the threshold voltages are input to the negative input terminals of the comparators 14a and 14b by the operations of the switches SW17 and SW18 according to the timing Φ20. The results of the decoding of the outputs from these comparators 14a and 14b are output from the decoder 15.

In the analog signal processing circuit 19, the test signal Tink is sampled by the capacitors C1 and C2 by the operations of the switches SW19 and SW20 according to the timing Φ12. At this time, the electrodes provided on the side opposite to the capacitors C1 and C2 are grounded by the operation of the switch SW27 according to the timing Φ10. Next, according to the timing Φ22, the output from the analog reference signal generation circuit 18 selected depending on the output from the decoder 15 is supplied to one side of the capacitor C1 by the operation of the switch SW23. Furthermore, one side of the capacitor C2 is connected to the output terminal of the operational amplifier 16 by the operation of the switch SW26 so that the capacitor C2 serves as a feedback element. With this configuration, the analog signal processing circuit 19 outputs an analog signal corresponding to the test signal ink that has been input thereto and multiplied by (C1+C2)/C2.

Next, when the first control signal Φ00-k is in the low level period and the second control signal Φ01-k is in the high level period in FIG. 3, the multivalued coding circuit 17 and the analog signal processing circuit 19 operate in response to the output from the sample hold circuit 10 or the output signal from the preceding stage 11[k−1].

First, in the multivalued coding circuit 17, the output from the sample hold circuit 10 or the output signal from the preceding stage 11[k−1] is input to the positive input terminals of the comparators 14a and 14b by the operations of the switches SW15 and SW16 according to the timing Φ11, while the threshold voltages are input to the negative input terminals of the comparators 14a and 14b by the operations of the switches SW17 and SW18 according to the timing Φ20. The results of the decoding of the outputs from these comparators 14a and 14b are output from the decoder 15. The results of the decoding of outputs from these comparators 14a and 14b are output from the decoder 15. In the analog signal processing circuit 19, the output from the sample hold circuit 10 or the output signal from the preceding stage 11[k−1] is sampled by the capacitors C1 and C2 by the operations of the switches SW21 and SW22 according to the timing Φ11. At this time, the side opposite to the capacitors C1 and C2 is grounded by the operation of the switch SW27 according to the timing Φ10.

Next, according to the timing Φ21, the output from the analog reference signal generation circuit 18 selected depending on the output from the decoder 15 is connected to one side of the capacitor C2 by the operation of the switch SW24. Furthermore, one side of the capacitor C1 is connected to the output terminal of the operational amplifier 16 by the switch SW25 so that the capacitor C1 serves as a feedback element. With this configuration, the analog signal processing circuit 19 outputs an analog signal corresponding to the output from the sample hold circuit 10 or the output signal from the preceding stage 11[k−1] that has been input thereto and multiplied by (C1+C2)/C2.

Next, when the first control signal Φ00-k is in the low level period and the second control signal Φ01-k is in the low level period in FIG. 3, the multivalued coding circuit 17 and the analog signal processing circuit 19 operate in response to the output from the sample hold circuit 10 or the output signal from the preceding stage 11[k−1].

First, in the multivalued coding circuit 17, the output from the sample hold circuit 10 or the output signal from the preceding stage 11[k−1] is input to the positive input terminals of the comparators 14a and 14b by the operations of the switches SW15 and SW16 according to the timing Φ11, while the threshold voltages are input to the negative input terminals of the comparators 14a and 14b by the operations of the switches SW17 and SW18 according to the timing Φ20. The results of the decoding of the outputs from these comparators 14a and 14b are output from the decoder 15. The results of the decoding of outputs from these comparators 14a and 14b are output from the decoder 15. In the analog signal processing circuit 19, the output from the sample hold circuit 10 or the output signal from the preceding stage 11[k−1] is sampled by the capacitors C1 and C2 by the operations of the switches SW21 and SW22 according to the timing Φ11. At this time, the side opposite to the capacitors C1 and C2 is grounded by the operation of the switch SW27 according to the timing Φ10.

Next, according to the timing Φ22, the output from the analog reference signal generation circuit 18 selected depending on the output from the decoder 15 is supplied to one side of the capacitor C1 by the operation of the switch SW23. Furthermore, one side of the capacitor C2 is connected to the output terminal of the operational amplifier 16 by the switch SW26 so that the capacitor C2 serves as a feedback element. With this configuration, the analog signal processing circuit 19 outputs an analog signal corresponding to the output from the sample hold circuit 10 or the output signal from the preceding stage 11[k−1] that has been input thereto and multiplied by (C1+C2)/C2.

As described above, when the error correction stage is the kth stage 11[k], in the high level period of the first control signal Φ00-k, the analog signal processing circuit 19 achieves signal amplification by a factor of (C1+C2)/C1 or (C1+C2)/C2 depending on whether the second control signal Φ01-k is in the high level period or the low level period. If ideal equivalence is established between the capacitors C1 and C2, the analog signal processing circuit 19 achieves signal amplification by a factor of 2 in either case. However, when there is an error in the relative accuracy between the capacitors C1 and C2, the amplification factors would be different. By calculating the output reflecting the error of the analog signal processing circuit 19 included in the kth stage 11[k] through a comparison between a digital output obtained as a result of the digital conversion using the (k+1)th stage to the (N−1)th stage and an expected digital output obtained as a result of digital conversion of the test signal, it is possible to detect the amount of error caused by the relative accuracy of the capacitors at the kthe stage 11[k].

Figure 6:
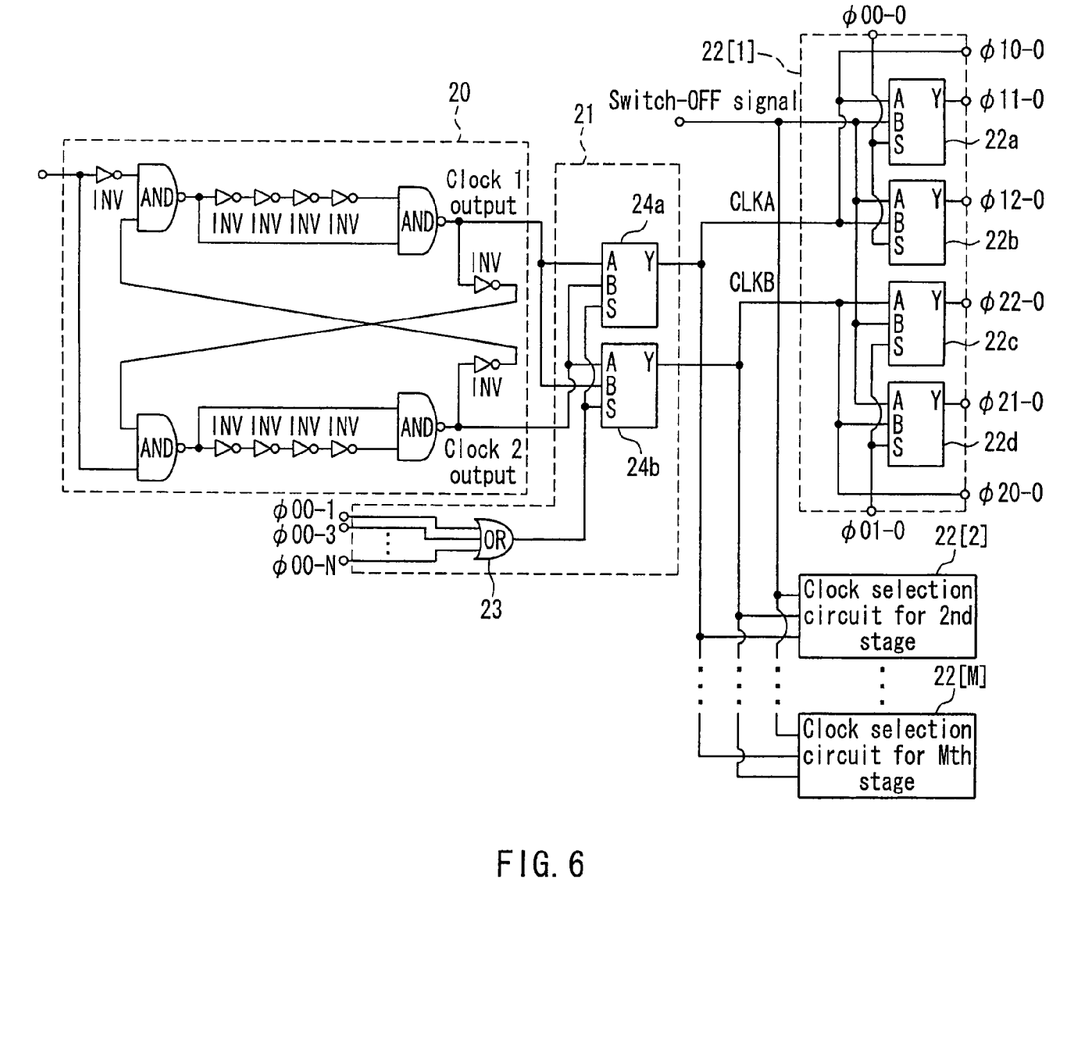
FIG. 6 is a circuit diagram showing an example of the configuration of a clock generator included in the pipeline A/D converter shown in FIG. 1.

Next, the configuration of the clock generator 12 that controls the operations of the respective stages according to the clock timing shown in FIG. 3 will be described with reference to FIG. 6. The clock generator shown in FIG. 6 includes a clock generation circuit 20, an odd/even-numbered stage setting circuit 21, and an operation determination circuits 22[1] to 22[M].

The clock generation circuit 20 generates a clock 1 output and a clock 2 output that is in reverse phase to the clock 1 output. The odd/even-numbered stage setting circuit 21 selects the clock 1 output and the clock 2 output by the selection circuits 24a and 24b, respectively, in response to the even-numbered input of the first control signal Φ00-k via an OR circuit 23. The operation determination circuit 22[1] outputs an operation clock that sets the operation of the first stage in response to the first control signal Φ00-0 and the second control signal Φ01-0. Although other operation determination circuits are not shown in FIG. 6, they also have the same configuration as the operation determination circuit 22[1]. That is, the operation determination circuits 22[1] to 22[M] output operation clocks that set the operations of the first to Mth stages in response to the first control signal Φ00-0 to Φ00-M and the second control signals Φ01-0 to Φ01-M, respectively. Note here that the operation determination circuits 22[1] is the operation determination circuit for the first stage, the operation determination circuits 22[2] is the operation determination circuit for the second stage, . . . , and the operation determination circuits 22[M] is the operation determination circuit for the Mth stage.

When error detection for the odd-numbered stages is performed in response to the first control signal Φ00-k from the digital computing circuit 13 shown in FIG. 1, i.e., when the first control signal is Φ00-0, Φ00-2, Φ00-4 . . . , the clock 1 output of the clock generation circuit 20 is output as an output CLKA of the odd/even-numbered stage setting circuit 21 and the clock 2 output of the clock generation circuit 20 is output as an output CLKB of the odd/even-numbered stage setting circuit 21. When error detection for the even-numbered stages is performed, i.e., when the first control signal is Φ00-1, Φ00-3, Φ00-5 . . . , the clock 2 output of the clock generation circuit 20 is output as the output CLKA of the odd/even-numbered stage setting circuit 21 and the clock 1 output of the clock generation circuit 20 is output as the output CLKB of the odd/even-numbered stage setting circuit 21. Thus, it is possible to make the operation clock phase in the case where the odd-numbered stages are subjected to error correction coincide with the operation clock phase in the case where the even-numbered stages are subjected to error correction.

To the operation determination circuits 22[1] to 22[M], the corresponding first control signals Φ00-0 to Φ00-M and second control signals Φ01-0 to Φ01-M are input, respectively. Furthermore, a switch-OFF signal and the output CLKA and CLKB of the odd/even-numbered stage setting circuit 21 also are input thereto. Among the operation determination circuits 22[1] to 22[M], those used for the odd-numbered stages and those used for the even-numbered stages are different from each other in the connection status of CLKA and CLKB. For example, in the operation determination circuit 22[1] for the first stage, when the first control signal Φ00-0 is in the high level period, the switch-OFF signal is output by a selection circuit 22a as a Φ11-0 output and CLKA is output by a selection circuit 22b as a Φ12-0 output. On the other hand, when the first control signal Φ00-0 is in the low level period, the switch-OFF signal is output as a Φ12-0 output and CLKA is output as a Φ11-0 output. Furthermore, when the second control signal Φ01-0 is in the high level period, the switch-OFF signal is output by a selection circuit 22c as a Φ22-0 output and CLKB is output by a selection circuit 22d as a Φ21-0 output. On the other hand, when the second control signal Φ01-0 is in the low level period, the switch-OFF signal is output as a Φ21-0 output and CLKB is output as an output from Φ22-0.

In the operation determination circuit 22[2] for an even-numbered stage, e.g., the second stage, since the supply of CLKA and CLKB is switched as described above, when the first control signal Φ00-1 is in the high level period, for example, the switch-OFF signal is output as a Φ11-1 output and CLKB is output as a Φ12-1 output. On the other hand, when the first control signal Φ00-1 is in the low level period, the switch-OFF signal is output as a Φ12-1 output and CLKB is output as a Φ11-1 output. Furthermore, when the second control signal Φ1-1 is in the high level period, the switch-OFF signal is output as a Φ22-1 output and CLKA is output as a Φ21-1 output. On the other hand, when the second control signal Φ01-1 is in the low level period, the switch-OFF signal is output as a Φ21-1 output and CLKB is output as a Φ22-1 output.

By using the clock generator 12 with the above-described configuration, in the pipeline A/D converter according to the present embodiment shown in FIG. 1, the stage to be subjected to error correction using the first control signal Φ00-k from the digital computing circuit 13 uses as an input signal the test signal ink instead of the analog output signal Vo(k−1) from the preceding stage and outputs a digital signal that has been processed using the stages downstream therefrom to the digital computing circuit 13. Furthermore, in the stage to be subjected to error correction using the second control signal Φ01-k from the digital computing circuit 13, the connection status of the capacitors C1 and C2 as passive elements is switched, and the stage uses the test signal Tink as an input signal and outputs a digital signal that has been processed using the stages downstream therefrom to the digital computing circuit 13. Using the result of computation with regard to the data before and after the switching by the second control signal Φ01-k, error detection is performed by the digital computing circuit 13. After this operation has been performed with respect to all the first to Mth stages to be subjected to error correction stage, correction data as the pipeline A/D converter is determined, and N-bit digital outputs D1 to DN output in accordance with the analog input signal Ain of the pipeline A/D converter are corrected using this correction data.

With the above-described configuration, at the time of error detection, the operations of the respective stages are controlled by the first control signals and the second control signals output from the digital computing circuit 13. The respective stages are operated in the same operation clock period at all times. Thus, as compared with a conventional pipeline A/D converter in which an error component is eliminated by operating the respective stages with an operation clock period divided into two periods, the pipeline A/D converter according to the present invention can perform an A/D conversion processing at a higher speed and also can detect an error in each of the stages more easily.

It is to be noted here that the input of a correction starting signal to the digital computing circuit 13, i.e., the start of an error detecting and correcting operation, usually is carried out when starting the operation of the pipeline A/D converter, prior to an ordinary A/D conversion operation. However, the error detecting and correcting operation can be performed with various timing other than the above, depending on the conditions under which the pipeline A/D converter is used.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A pipeline A/D converter comprising:
   a plurality of stages connected in series, each of which operates for A/D conversion and outputs a digital signal;
   a digital computing portion that performs computation for outputting an A/D converted output signal based on the digital signal output from each of the stages; and
   a clock generating portion that supplies a clock signal for controlling an operation of each of the stages,
   each of the stages comprising:
   a reference signal output portion that outputs a predetermined analog reference signal in accordance with the digital signal from the preceding stage;
   an analog signal processing portion that adds/subtracts the analog reference signal to/from an analog output signal from the preceding stage and outputs the thus-obtained result as an analog output signal of the present stage; and
   a multivalued coding portion that outputs the digital signal in accordance with the analog output signal of the present stage,
   the analog signal processing portion comprising an operational amplifier, a first passive element, and a second passive element, the analog output signal of the preceding stage being sampled by both the passive elements in a first period while one of the passive elements is used as a feedback element of the operational amplifier in a second period so that the signal sampled by the other passive element is added/subtracted to/from the analog reference signal of the reference signal output portion by the operational amplifier,
   wherein the digital computing portion outputs first and second control signals for controlling the operation of each of the stages, performs computation by detecting a unique digital-conversion-error value based on the digital signal obtained by the operation of each of the stages performed based on the first and second control signals, and corrects the digital conversion error,
   the analog signal processing portion and the multivalued coding portion can select a test signal instead of the analog output signal in accordance with the first control signal from the digital computing portion, and
   the analog signal processing portion selects and uses one of the first passive element and the second passive element as the feedback element in the second period in accordance with the second control signal from the digital computing portion.

2. The pipeline A/D converter according to claim 1, wherein, in accordance with the first and second control signals from the digital computing portion, the clock signal supplied by the clock generating portion is controlled so as to correspond to the operation of each of the stages.

3. The pipeline A/D converter according to claim 2, wherein the clock generating portion is configured so as to select and output the clock signal depending on whether the detection of the unique digital-conversion-error value by the digital computing portion is performed in the even-numbered stage or the odd-numbered stage.

4. A pipeline A/D conversion method that performs A/D conversion using a plurality of stages connected in series, each of which operates for A/D conversion and outputs a digital signal, the method comprising:

operating each of the stages in such a manner that an analog output signal output from the preceding stage is sampled by first and second passive elements, the analog output signal is output by using one of the passive elements as a feedback element and performing computation using the signal sampled by the other passive element, and the digital signal is output in accordance with the analog output signal, and outputting an A/D converted output signal by performing a digital computing operation based on the digital signal from each of the stages, wherein the method further comprises the steps of switching an input signal to each of the stages to a test signal by a first control signal; and switching the passive element used as the feedback element by a second control signal.

* * * * *